United States Patent [19]

Chen

[11] Patent Number: 6,002,516
[45] Date of Patent: Dec. 14, 1999

[54] VERTICAL CASSETTE ELEVATOR AND LOAD LOCK VIEWER

[75] Inventor: Jia-Rong Chen, Hsing-Chu, Taiwan

[73] Assignee: Taiwan Semiconductor Manufacturing Company, Ltd., Hsin-chu, Taiwan

[21] Appl. No.: 09/089,150

[22] Filed: Jun. 2, 1998

[51] Int. Cl.[6] .............................. G02B 23/08; A61B 1/00
[52] U.S. Cl. .......................... 359/402; 359/367; 359/403
[58] Field of Search ..................................... 359/362, 363, 359/367, 383, 399, 400, 402, 403, 406, 725, 726, 730, 857, 860, 858, 859, 895

[56] References Cited

U.S. PATENT DOCUMENTS

| | | | |
|---|---|---|---|
| 4,251,128 | 2/1981 | Feinbloom | 359/385 |
| 5,469,236 | 11/1995 | Roessel | 359/402 |

*Primary Examiner*—Cassandra Spyrou
*Assistant Examiner*—Fayez Assaf
*Attorney, Agent, or Firm*—Tung & Associates

[57] ABSTRACT

A viewfinder device for viewing the interior of dark, inaccessible areas and environments, such as the chamber of a vertical cassette elevator or load lock used in semiconductor wafer fabricating systems, consisting of three housing sections forming a displaced optical path from the interior of the chamber on which the device is mounted through a viewport on the chamber to a viewfinder and viewing lens at the observing end of the device. The first housing section is mounted on a suitable rotater assembly on the top wall of the chamber to the viewport by an adapter member, and is fitted in its side with an illuminating means, for illuminating the interior of the chamber. An image reflected from the chamber interior passes up through the optical column formed by the first section and is reflected by a reflector mirror, disposed at an angle at the top of the first section, through the optical column formed within the center section. A second reflector mirror is disposed at the other end of the center section arranged in a plane parallel to that of the first reflector mirror so as to displace the axis of the image by the distance between the mirrors. The displaced image is then reflected to a viewfinder, including a viewing lens, for observation by a technician in the event that a question or problem arises during the operating of the processing machinery requiring the viewing of the interior of the VCE or LL chambers. To facilitate this viewing, the viewfinder device can be rotated through a complete angle of 360° by means of the rotater assembly.

9 Claims, 1 Drawing Sheet

VERTICAL CASSETTE ELEVATOR AND LOAD LOCK VIEWER

FIELD OF THE INVENTION

The present invention relates generally to the manufacture of semiconductor wafers and, more particularly, to a method and means for readily observing wafers when disposed in a vertical cassette elevator (VCE) or a load lock (LL) during transfer into and out of a fabrication processing system.

PRIOR ART

Currently in operating the processing machinery for manufacturing semiconductor wafers it is difficult, during the steps involving transfer of the wafer holding cassettes into and out of the fabrication chamber, for an operator to have access to or observe the condition of the cassette or wafers since they are disposed either in a dark vertical cassette elevator or a load lock. This difficulty poses a problem when an operator is troubleshooting or when attempting to determine a wafer count or a condition requiring a judgement regarding continuing machine operation.

PROBLEM TO BE SOLVED

It is accordingly a problem in the semiconductor wafer fabrication art to view the condition of wafers or cassettes during transfer to and from a fabrication chamber while they are disposed in a vertical cassette elevator (VCE) or a load lock (LL).

OBJECTS OF THE INVENTION

It is therefore an object of the present invention to provide a method and means for viewing an article such as a cassette or wafer in an inaccessible dark environment such as a VCE or LL.

It is another object of the present invention to provide a method and means for providing a suitable viewfinder arrangement for observing the interior of inaccessible dark environments such as a VCE or LL used in wafer fabrication.

SUMMARY OF THE INVENTION

The present invention is directed to providing the capability in a semiconductor wafer or like fabrication system of viewing the interior of dark, inaccessible areas and environments and involves a viewfinder device which may be mounted for rotation on a viewing port located in an appropriate wall, e.g., the top wall, of a chamber or compartment, the interior of which is to be viewed. The viewfinder device is constructed of three connected optical columns. The first optical column has its axis arranged substantially perpendicular to the plane of the viewing port and one end connected for rotation thereon, and contains a source of illumination. The second optical column has one end connected to the other end of the first column and its axis disposed substantially perpendicular to its axis, and has reflector mirrors at each end arranged at an angle with respect to the second column axis and parallel to each other. The third optical column has one end connected to the other end of the second column and its axis disposed substantially perpendicular to its axis, and has a viewfinder and lens at its other end through which the interior of the chamber, illuminated by the source in the first optical column, can be viewed through illumination reflected through the port and the two reflector mirrors to the lens. The end of the first optical column at the viewing port is mounted thereon by a rotator device that enables the viewing of the chamber interior through an arc of 360°. Thus, the interior of a VCE or LL can be viewed using the viewing device by rotatably mounting the device on the top wall of the elevator or lock.

BRIEF DESCRIPTION OF THE DRAWINGS

These objects, features and advantages will become apparent by the following specification and the appended drawings in which.

DETAILED DESCRIPTION OF THE PREFERRED EMBODIMENT

The present invention provides a method and means for achieving the capability in a semiconductor wafer or like fabrication system of viewing the interior of dark, inaccessible areas and environments and involves a viewfinder device which may be mounted for rotation on a viewing port located in an appropriate wall, e.g., the top wall, of a chamber or compartment such as in a VCE or LL, the interior of which is to be viewed. The viewfinder device is constructed of three connected optical columns with the center column having the other two disposed on and normal to its opposite ends and extending oppositely therefrom. In one embodiment, the first optical column has one end connected for rotation on the viewing port with its axis arranged substantially perpendicular to the plane of the viewing port and contains a source of illumination for illuminating the chamber interior through the port. The center or second optical column has angled reflector mirrors disposed at each end in parallel planes for displacing an image from the chamber interior on the axis of the first optical column onto the axis of the third optical column which is fitted with a viewfinder and lens at its other end for viewing the image from the interior. Alternatively, the two reflector mirrors may be mounted in the ends of the first and third optical columns, which ends are connected to a center portion that is empty. In either embodiment, the first optical column is fitted with a rotator attachment on its one end having an adapter for connecting it to the viewing port on the chamber wall, so that the viewfinder device can be rotated through 360° for viewing the interior of the chamber.

Figure 1:
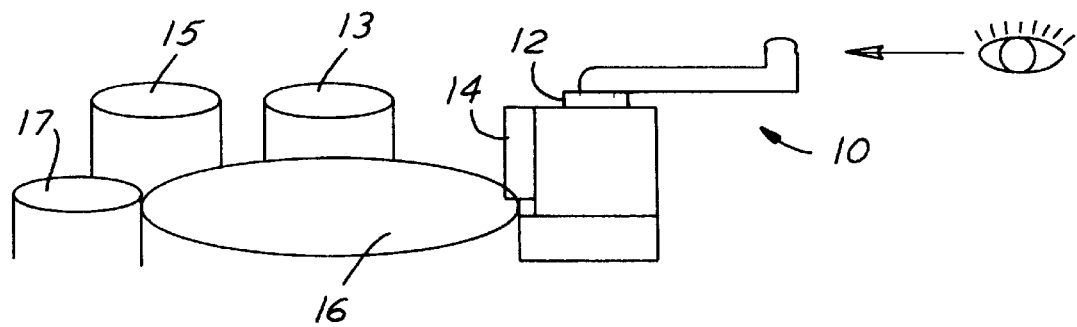
FIG. 1 illustrates a viewfinder device in accordance with the present invention mounted in a wafer fabricating machine environment on the top of the VCE and LL chambers for viewing therein.

As seen in FIG. 1, a viewfinder device 10 in accordance with the present invention is shown mounted in a wafer fabricating machine environment on the top of vertical cassette elevator (VCE) and load lock (LL) chambers 12 and 14 for viewing therein. In operation, a wafer holding cassette (not shown) is inserted in the VCE 12 and brought into registration with the load lock LL 14 for transferring the semiconductor wafers into the processing environment to the transport device 16 by which they are served to the various processing stations 13, 15, and 17 and returned to the cassette in the LL 14 when fabricated. The viewfinder device 10 can be used to view the interior of the VCE 12 and LL 14 during the processing to check the number of wafers in the cassette or the position of the cassette if a problem is encountered in the inserting or withdrawing operation.

Figure 2:
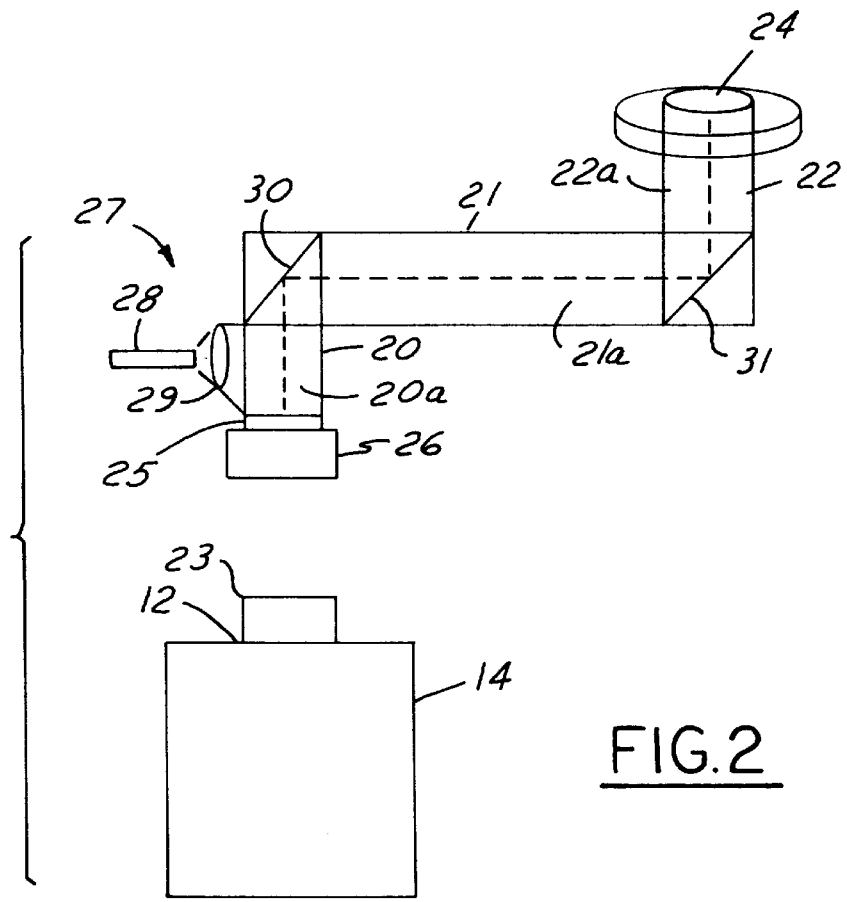
FIG. 2 is a diagrammatic view of the viewfinder device of FIG. 1 showing the details of the operating components.

The structural details of the viewfinder device 10 are shown in FIG. 2 consisting essentially of three housing sections 20, 21, and 22 forming a displaced optical path from the interior of a VCE 12 or LL 14 on which the device is mounted through a viewport 23 to a viewfinder 32 and viewing lens 24. The first housing section 20 is mounted on a suitable rotater assembly 25 which is connected at the top wall of the VCE or LL chamber to the viewport 23 by an adaptor member 26. The side wall of the first section 20 is fitted with an illuminating means 27 such as a light source 28 with a lens 29 for illuminating the interior of the VCE or LL chamber. Light or radiation forming an image reflected from the chamber interior passes up through the optical column 20a formed by the first section 20 and is reflected by a reflector mirror 30, disposed at an angle at the top of the first section, through the optical column 21a formed within the center section 21. A second reflector mirror 31 is disposed at the other end of the center section 21 arranged in a plane parallel to that of the first reflector mirror 30 so as to displace the axis of the image by the distance between the mirrors 30 and 31. The displaced image is then reflected to the viewfinder 32, including the viewing lens 24, for observation by a technician in the event that a question or problem arises during the operating of the processing machinery requiring the viewing of the interior of the VCE or LL chambers. To facilitate this viewing, the viewfinder device 10 can be rotated through a complete angle of 360° by means of the rotater assembly 25.

It will be seen that an improved viewfinder device is provided for viewing the interior of dark, inaccessible areas and environments, such as a chamber or compartment in a VCE or LL, and involves a comparatively simple viewfinder structure, which may be mounted for rotation on a viewing port located in an appropriate wall of the chamber, and comprises three connected optical columns which transmit images of the chamber interior and displace them for convenient viewing through a displaced viewing finder and lens that may be rotated about the axis of the viewing port through 360°.

The present invention has been described in an illustrative manner, but it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations of the invention, such as fast recovery diodes.

The embodiment of the invention in which an exclusive property or privilege is claimed are defined in the following claims.

What is claimed is:

1. A viewfinder device for viewing the dark interior of a processing chamber comprising:

an opening disposed in a wall of said chamber;

first optical column means, with one end mounted at said opening, for directing illumination through said opening into the interior of said chamber and axially transmitting images formed by reflected illumination from the interior of said chamber through said opening;

second optical column means, having one end connected to the other end of said first optical column means and having its axis oriented normal to the axis thereof, for axially transmitting images formed by said reflected illumination;

third optical column means, having one end connected to the other end of said second optical column means and having its axis oriented normal to the axis thereof, for axially transmitting images formed by said reflected illumination;

reflector means, disposed at the one and the other ends of said second optical column means, for displacing said axially transmitted images formed by reflected illumination, from the axis of said first optical column means to the axis of said third optical column means; and viewfinder means, disposed at the other end of said third optical column means, for viewing the reflected axially transmitted images formed by said reflected illumination.

2. A device as in claim 1, wherein said reflector means comprises:

first reflector means, mounted in the other end of said first optical column means, for reflecting said axially transmitted images formed by reflected illumination, normally with respect to said axial transmission, axially through said second optical column means; and second reflector means, mounted at said one end of said third optical column means, for reflecting said axially transmitted images formed by reflected illumination, normally with respect to said axial transmission, axially through said third optical column means.

3. A device as in claim 1, wherein said reflector means comprises:

first reflector means, mounted in said one end of said second optical column, for reflecting said axially transmitted images formed by reflected illumination, normally with respect to said axial transmission, axially through said second optical column means;

second reflector means, mounted at the other end of said second optical column means, for reflecting said axially transmitted images formed by reflected illumination, normally with respect to said axial transmission, axially through said third optical column means.

4. Apparatus as in claim 1, further comprising means for rotatably mounting said one end of said first optical column means at said opening.

5. Apparatus for viewing the dark interior of a processing chamber comprising:

a viewing port disposed in a wall of said chamber;

a source of illumination;

first optical column means, having one end mounted on said viewing port, for directing illumination from said illumination source through said viewing port into the interior of said chamber and axially transmitting images formed by reflected illumination from the interior of said chamber through said viewing port;

second optical column means, having one end connected to the other end of said first optical column means and having its axis oriented normal to the axis thereof, for axially transmitting images formed by said reflected illumination;

third optical column means, having one end connected to the other end of said second optical column means and having its axis oriented normal to the axis thereof, for axially transmitting images formed by said reflected illumination;

first reflector means, disposed at the other end of said first optical column means and said one end of said second optical column means, for reflecting said axially transmitted images formed by reflected illumination, normally with respect to said axial transmission, axially through said second optical column means;

second reflector means, disposed at the other end of said second optical column means and said one end of said third optical column means, for reflecting said axially transmitted images formed by reflected illumination, normally with respect to said axial transmission, axially through said third optical column means; and viewfinder means, disposed at the other end of said third optical column means, for viewing the reflected axially transmitted images formed by reflected illumination.

6. A device as in claim 5, further comprising means for rotatably mounting said one end of said first optical column means on said viewing port.

7. A viewfinder device for viewing the dark interior of a processing chamber comprising:

an opening disposed in a wall of said chamber;

first optical column means, with one end mounted at said opening, for directing illumination through said opening into the interior of said chamber and axially transmitting images formed by reflected illumination from the interior of said chamber through said opening;

second optical column means, having one end connected to the other end of said first optical column means and having its axis oriented normal to the axis thereof, for axially transmitting images formed by said reflected illumination;

third optical column means, having one end connected to the other end of said second optical column means and having its axis oriented normal to the axis thereof, for axially transmitting images formed by said reflected illumination;

reflector means, disposed at the one and the other ends of said second optical column means, for displacing said axially transmitted images formed by reflected illumination, from the axis of said first optical column means to the axis of said third optical column means;

viewfinder means, disposed at the other end of said third optical column means, for viewing the reflected axially transmitted images formed by said reflected illumination; and means for rotatably mounting said one end of said first optical column means at said opening such that said first optical column means is rotatable on said opening through a complete angle of 360°.

8. A device as in claim 7, wherein said reflector means comprises:

first reflector means, mounted in the other end of said first optical column means, for reflecting said axially transmitted images formed by reflected illumination, normally with respect to said axial transmission, axially through said second optical column means; and second reflector means, mounted at said one end of said third optical column means, for reflecting said axially transmitted images formed by reflected illumination, normally with respect to said axial transmission, axially through said third optical column means.

9. A device as in claim 7, wherein said reflector means comprises:

first reflector means, mounted in said one end of said second optical column, for reflecting said axially transmitted images formed by reflected illumination, normally with respect to said axial transmission, axially through said second optical column means;

second reflector means, mounted at the other end of said second optical column means, for reflecting said axially transmitted images formed by reflected illumination, normally with respect to said axial transmission, axially through said third optical column means.

\* \* \* \* \*